(12) United States Patent
Mihic et al.

(10) Patent No.: US 8,895,160 B2
(45) Date of Patent: Nov. 25, 2014

(54) PRODUCT AND METHOD FOR ITS MANUFACTURE WITHIN MATERIAL PROCESSING

(75) Inventors: Ragnhild Mihic, Galve (SE); Peter Mihic, Galve (SE)

(73) Assignee: Mircona AB, Gavle (SE)

( * ) Notice: Subject to any disclaimer, the term of this patent is extended or adjusted under 35 U.S.C. 154(b) by 1132 days.

(21) Appl. No.: 12/680,367

(22) PCT Filed: Sep. 29, 2008

(86) PCT No.: PCT/SE2008/051090
§ 371 (c)(1),
(2), (4) Date: Aug. 3, 2010

(87) PCT Pub. No.: WO2009/045155
PCT Pub. Date: Apr. 9, 2009

(65) Prior Publication Data
US 2012/0121349 A1    May 17, 2012

Related U.S. Application Data

(60) Provisional application No. 60/976,502, filed on Oct. 1, 2007.

(30) Foreign Application Priority Data

Oct. 1, 2007   (SE) ...................................... 0702184

(51) Int. Cl.
*B32B 9/04*    (2006.01)
*B32B 15/04*   (2006.01)
(Continued)

(52) U.S. Cl.
CPC ........... *C23C 14/0658* (2013.01); *B23B 27/002* (2013.01); *B23B 27/007* (2013.01); *B23B 29/043* (2013.01); *B23B 31/005* (2013.01);
(Continued)

(58) Field of Classification Search
CPC ............. B23B 27/002; C23C 14/0057; C23C 14/0658; C23C 16/347
See application file for complete search history.

(56) References Cited

U.S. PATENT DOCUMENTS 5,193,945 A * 3/1993 Nakayama et al. ............. 407/66
5,389,642 A    2/1995 Dorsch et al.
(Continued)

FOREIGN PATENT DOCUMENTS

DE    19948891    4/2001
JP    6228137     8/1994
(Continued)

OTHER PUBLICATIONS

Musil, J. "Hard and superhard nanocomposite coatings," 2000, Surface & Coatings Technology, vol. 125, pp. 322-330.*

(Continued)

*Primary Examiner* — Gwendolyn Blackwell
*Assistant Examiner* — Seth Dumbris
(74) *Attorney, Agent, or Firm* — Renner, Otto, Boisselle & Sklar, LLP

(57) ABSTRACT

The present invention provides an appliance for chip removal applications comprising a vibration-damping material wherein the vibration-damping material is a material arranged by nano-dimensional cluster form. The present invention additionally provides a method for manufacturing said appliance. The present invention provides also an appliance obtainable by said method. Additionally the present invention provides an article or work piece for use in an appliance for chip removal applications. Also a computer program is provided for controlling the above method.

42 Claims, 20 Drawing Sheets

(51) Int. Cl.
*C01C 3/00* (2006.01)
*C01B 31/30* (2006.01)
*B23Q 11/00* (2006.01)
*B25D 17/00* (2006.01)
*C23C 14/06* (2006.01)
*B23B 27/00* (2006.01)
*B23B 29/04* (2006.01)
*B23B 31/00* (2006.01)
*C23C 14/00* (2006.01)
*C23C 16/34* (2006.01)
*C23C 28/02* (2006.01)
*C23C 28/00* (2006.01)

(52) U.S. Cl.
CPC ......... *C23C 14/0057* (2013.01); *C23C 16/347* (2013.01); *C23C 28/023* (2013.01); *C23C 28/322* (2013.01); *C23C 28/34* (2013.01); *C23C 28/345* (2013.01); *C23C 28/347* (2013.01); *C23C 28/42* (2013.01); *B23B 2226/18* (2013.01); *B23B 2228/10* (2013.01); *Y10S 428/9088* (2013.01)
USPC ........... 428/704; 428/621; 428/627; 428/698; 428/702; 428/908.8; 423/384; 423/439; 408/143; 409/141; 173/162.1

(56) References Cited

U.S. PATENT DOCUMENTS

| | | | | |
|---|---|---|---|---|
| 5,593,234 | A * | 1/1997 | Liston | 384/492 |
| 5,776,615 | A * | 7/1998 | Wong et al. | 428/698 |
| 6,465,057 | B1 * | 10/2002 | Nakahigashi et al. | 427/569 |
| 6,617,058 | B2 * | 9/2003 | Schier | 428/698 |
| 8,460,763 | B2 * | 6/2013 | Kouznetsov et al. | 427/569 |

FOREIGN PATENT DOCUMENTS

| | | | | |
|---|---|---|---|---|
| JP | 2002/233911 | | 8/2002 | |
| JP | 2002-233911 A | | 8/2002 | |
| JP | 2003-117751 A | | 4/2003 | |
| JP | 2004/202649 | | 7/2004 | |
| JP | 2004-202649 A | | 7/2004 | |
| SE | WO2005/075134 | * | 8/2005 | ............. B23B 29/00 |
| TW | 468148 | | 12/2001 | |
| TW | 585960 | | 5/2004 | |
| TW | M277500 | | 10/2005 | |
| TW | I269849 | | 1/2007 | |
| TW | M314601 | | 7/2007 | |
| WO | WO 00/52225 | * | 9/2000 | ............. C23C 16/36 |
| WO | 2005/075134 | | 8/2005 | |
| WO | 2005-075134 A1 | | 8/2005 | |
| WO | 2005-107982 A1 | | 11/2005 | |

OTHER PUBLICATIONS

Japanese Office Action with translation for corresponding patent application No. 2010-527911 dated Dec. 4, 2012.
International Search Report for corresponding application No. PCT/SE2008/051090 dated Jan. 20, 2009.
Russian Office Action Translation for corresponding application No. PCT/SE2008/051090.
Chinese Office Action for corresponding patent application No. 200880118735.7 dated Jul. 24, 2012.
Office Action for corresponding Polish patent application No. P.391672 dated May 24, 2013.
Office Action with Search Report for corresponding Taiwan Patent Application No. 097135314 dated Oct. 7, 2013.
English translation of Notice of Office Action for corresponding Korean Patent Application No. 10-2010-7008642 dated Aug. 18, 2014.

* cited by examiner

Modal Analysis

Noise record from machining with conventional boring bar and damped boring bar

To pump

The scheme of experiment

M1 = Plasma spraying
M2 = Electrolytic and chemical deposition
M3 = Phosphating
M4 = Nitriding (white layer)
M5 = Boronising
M6 = CVD
M7 = PVD, PACVD
M8 = New hybrids PVD+PACVD technology, i.e. one aspect of the present invention
   PVD = Physical Vapour Deposition
   PACVD = Plasma Assisted Chemical Vapour Deposition a)

b)

c) I, II and III d)

PRODUCT AND METHOD FOR ITS MANUFACTURE WITHIN MATERIAL PROCESSING

This application is a national phase of International Application No. PCT/SE2008/051090 filed Sep. 29, 2008 and published in the English language.

The present invention relates to a tool holder and a method for manufacturing the same whereby a vibration-damping layer of a ceramic material is present on said tool holder.

BACKGROUND

Tool holders in manufacturing machines have a tendency to vibrate and give rise to noise when in use. Such vibration disturbs the work process by having a negative effect on the accuracy of the result. The vibrations also give rise to a troublesome disturbing noise that worsens the environment around the manufacturing machine.

A perfect manufacturing machine does not give rise to any vibrations, and all energy is passed to the process that is to be carried out. In practice, vibrations always arise when the various parts of the machine work against each other. As the machine becomes more and more worn, changes in its dynamic properties take place. This means that new types of vibration can arise during different periods of the lifetime of the machine. The vibrations can lead to poor surface finish of the work piece and lower accuracy of the work piece, further wear on the machine and on tools, e.g. cutting tools, with, in the worst case, irreparable damage as a consequence.

During the processing of materials, e.g. metal, plastic, wood or composite materials, problems also arise that are caused by the high level of noise caused by vibrations from the processing and the noise of the machine. It is important to be able to remove major parts of the vibration noise within the frequency interval that is uncomfortable for the human ear. It is desirable that the level is reduced to a level below 80 dB.

A further problem is the relatively slow deposition rate available in methods known previously for deposition of vibration damping material. Another problem with previously known methods for deposition of vibration damping material is that the deposition needs to be performed at a relatively high temperature which may be detrimental for the characteristics of the article or work piece to be deposited. Accordingly said methods for deposition may e.g. damage the internal and/or the external structure of the article or work piece to be deposited or damage the annealing of said article or work piece.

A problem with cutting inserts for use in insert holder is their short life time due to e.g. shocks and vibration. By applying vibration damping layer between insert and insert holder one can decrease or eliminate the shocks and by this way increase the inserts life time.

It would accordingly be desirable to have vibration damped tool holders whereby wear and/or vibration is reduced. Further it would be desirable to have vibration damped tool holders which keep accuracy high and whereby fatigue of the material can be avoided. Accordingly it would be desirable to have vibration damped tool holder which eliminates or alleviates the drawbacks mentioned above.

SUMMARY OF THE INVENTION

The present invention solves one or more of the above problems by providing according to a first aspect an appliance for chip removal applications comprising a vibration-damping material wherein the vibration-damping material is a material arranged by nano-dimensional cluster form.

The present invention provides also according to a second aspect a method for manufacturing an appliance for chip removal applications according to the first aspect, comprising the following steps:
  a) providing an appliance; and
  b) precipitating on said an appliance a material in nano-dimensional cluster form, which preferably is ceramic, thereby giving a vibration damping effect in said appliance.

According to a third aspect of the present invention there is provided an appliance obtainable by a method according to the second aspect.

According to a fourth aspect of the present invention there is provided use of a work piece or an article obtainable from a method for deposition of a carbon nitride material on a work piece or an article in a reactor comprising a magnetron cathode (wherein said carbon nitride material preferably when applied consists of nano and/or sub-nano dimensional clusters/aggregates), said method comprising:
  (a) providing so that the cathode have magnetic field (preferably a magnetron-like magnetic field) in the reactor;
  (b) placing a work piece or an article in the reactor;
  (c) introducing one or more carbon containing process gases and reactive gas into the reactor;
  (d) energizing the process gas and reactive gas to form a plasma to decompose the process gas into radicals and further to deposit carbon material on to the work piece or article substrate and ionize the reactive gas to increase the rate of nitrogen chemisorption to the carbon; and
  (e) exhausting the gases after decomposition and chemisorption from the chamber,
  in an appliance for chip removal applications, preferably in cutting tools, most preferred in tools which are turning, boring, drilling, reaming, threading, milling, planning, deburring, drifting and/or broaching. The magnetic field can be of different topology. Preferably it can be magnetron-like magnetic field. In the above method according to the fourth aspect of the invention one of the corner stones is a CVD process which enables the cracking of the carbon containing gases such as methane, acetylene, carbon oxide, carbon dioxide into radicals and accordingly allows carbon containing radical deposition onto the work piece or article. The other corner stone is the PVD hardware which is used in said method.

According to a fifth aspect of the present invention there is provided a computer program stored on a data carrier for performing the method according to the third aspect.

DETAILED DESCRIPTION OF THE INVENTION

It is intended throughout the present description that the expression "appliance for chip removal applications" embraces any chip removal tool, stationary or rotating, such as tools for turning, milling, drilling, deburring, broaching or drifting etc., or cutting edges or cutting inserts for use in said tools, and holding devices for said chip removal tools, such as collets, tool holders, mounting devices etc. for mounting in a machine tool.

There are two main approaches in damping design: passive and active damping. Passive damping methods use high damping capacity materials in the machine design and/or application of the damping layers between machine parts. These methods are simple and reliable. Active damping employs sensors and actuators, and can be used for low frequency excitations. Present invention relates to the passive approach.

Damping of vibration can be achieved by applying of a damping material to the subject machine. Damping capacity of the materials relates to the ability to convert mechanical vibration energy into thermal energy by internal friction between domains or phases boundary. This mechanism is characteristic for metals alloys. Another mechanism transformation of the vibration energy into heat is realised in the viscoelastic materials. These are viscoelastic polymeric plastics or elastomers. These materials are known as viscoelastic because they have the properties of both viscous (energy dissipating) and elastic (energy storing) materials.

High-damping metal alloys, while having better damping properties than common metals, do not provide the same level of damping that viscoelastic materials do. See U.S. Pat. No. 5,573,344 and patent application US2005084355. However, viscoelastic materials are generally only effective for a small temperature range and have poor tribological properties.

Low damping property of alloys relatively to elastomers in particular is caused by large dimensions of the domains arranging material that strongly limiting friction surface of boundary between domains. The characteristic domain size is about 1-20 micrometers. See: Y. Liu, G. Yang, Y. Lu, L. Yang, Damping behaviour and tribological properties of as-spray-deposited high silicon alloy ZA27, Journal of materials processing technology, 87 (1999) 53-58 and K. K. Jee, W. Y. Jang, S. H. Baik, M. C. Shin, Damping mechanism and application of Fe—Mn based alloys, Materials science and Engineering A273-275 (1999) 538-542. More generally one can talk about typical metal alloys domain size as large as hundreds of micrometers.

Viscoelastic polymers such as acrylic viscoelastic polymer are arranged by long chain molecules. Most common from the commercial standpoint are the linear, branched, and network structures. The characteristic thickness of viscoelastic damping layer that demonstrate high damping capacity is about hundreds of micrometers (as much as domain size in alloys). See patent US2005084355 and 3M™ Damping Foil 2552, Product description, Industrial adhesives and tape division, 3M centre, Building 21-1W-10, 900 Bush Avenue, St. Paul, USA.

So, one can conclude that at now vibration damping technology is based on the coatings having good tribological but bad damping properties or opposite bad tribological and good damping properties.

The present invention can in a way be summarised as a creation of a new type of coatings combining good tribological and vibration damping properties. Moreover the new vibration damping coatings have remarkable damping capacity already at the level of tenths microns of thickness to and can be used in micro-technology. To achieve these properties the present invention relates to the sub-nano and nano-structured materials arranging damping layers (coatings) applied between contacting machines parts.

This approach is thought to be effective for damping because of:

1. In mechanical structure systems, there exist contact stiffness and contact damping in the interface of two parts. They have a great effect on the behaviour, especially on the dynamic behaviour of the whole system. The interfaces often are the weakest chains in the whole mechanical structural system. Therefore damping and its importance in structures has become increasingly significant for controlling the undesirable effects of vibration.

2. Materials arranged by sub-nano and nano sized domains have several decades larger surface between domains at the same damping layer thickness. Therefore the efficiency of vibration energy transformation into heat by friction between domains surfaces is several decades higher comparably to materials arranged by micro-sized domains.

It is intended throughout the present description that the expression "damping material phases" embraces domains, or aggregates, or crystallites, or clusters, or layers arranging the material.

The appliance, which may e.g. be a tool holder, a cutting insert, drill or rotary file, may consist of an essentially pure metal or an alloy (e.g. steel) comprising two or more different metals besides the vibration damping (which preferably is a ceramic material) which is added as set out in the second aspect of the present invention.

According to a preferred embodiment of the first aspect of the present invention there is provided an appliance wherein said material is a ceramic material.

According to a preferred embodiment of the first aspect of the present invention there is provided an appliance wherein said appliance is movable or immovable.

According to a preferred embodiment of the first aspect of the present invention there is provided an appliance wherein said ceramic material is present as a layer on the surface of said appliance wherein said layer is from 1 µm to 1 cm, preferably from 1 µm to 1000 µm, most preferred from 50 to 500 µm.

According to a preferred embodiment of the first aspect of the present invention there is provided an appliance wherein said nano-dimensional cluster of said ceramic material has a size of from 0.5 to 100 nm.

According to a preferred embodiment of the first aspect of the present invention there is provided an appliance wherein said ceramic material is selected from the group consisting of $CN_x$, TiN, TiAlN, $Al_2O_3$ or mixtures thereof.

According to a preferred embodiment of the first aspect of the present invention there is provided an appliance wherein said ceramic material is $CN_x$.

According to a preferred embodiment of the first aspect of the present invention there is provided an appliance wherein the applied damping material is a composite material arranged by multilayer structure that consists of alternated layers of metal or metal compounds of one kind and metal or metal compounds of another kind.

According to a preferred embodiment of the first aspect of the present invention there is provided an appliance wherein the applied damping material is a composite material arranged by multilayer structure that consists of alternated layers of metals and metal nitride.

According to a preferred embodiment of the first aspect of the present invention there is provided an appliance wherein the applied damping material is a composite material arranged by multilayer structure that consists of alternated layers of metals and metal oxide.

According to a preferred embodiment of the first aspect of the present invention there is provided an appliance wherein the applied damping material is a composite material arranged by two layer structure that consists of a viscoelastic layer and a carbon nitride layer, preferably said carbon nitride layer is a constraining layer. Said viscoelastic layer may comprise 3M™ Damping Foil 2552 (see Product description, Industrial adhesives and tape division, 3M centre, Building 21-1W-10, 900 Bush Avenue, St. Paul, USA).

According to a preferred embodiment of the first aspect of the present invention there is provided an appliance wherein the uniformity of thickness of vibration damping layer is from 0.1 to 10%.

According to a preferred embodiment of the first aspect of the present invention there is provided an appliance wherein the vibration damping layer in nano-dimensional cluster form has a number of sub-layers in a superlattice which is 10-10000, preferably 100-1000.

According to a preferred embodiment of the first aspect of the present invention there is provided an appliance wherein said appliance is a tool holder, a cutting insert, a drill, a rotary file, a reamer (scraping cutter), a collet or a mounting device.

According to a preferred embodiment of the first aspect of the present invention there is provided an appliance wherein said appliance is a tool holder (1) comprising:
a shaft (2) intended to be arranged in a manufacturing machine or in a tool holder of a manufacturing machine; a head (3) on which a cutter (cutting insert) is intended to be arranged; and a vibration-damping material, (4) arranged such that the cutter is in contact with the manufacturing machine solely via the vibration-damping material (4). Said tool holder may have a cutting insert which is permanent or movable, i.e. replaceable.

According to a preferred embodiment of the first aspect of the present invention there is provided an appliance, wherein said vibration-damping material is present as a thin layer on the surface of said tool holder, preferably only essentially on the surface which is to be in contact with the cutting edge/insert and/or on the surface which is to be in contact with the manufacturing machine holding said tool holder or a tool holder of a manufacturing machine holding said tool holder. The cutting insert/edge may further be deposited with said vibration-damping material on one or on all surfaces.

According to a preferred embodiment of the first aspect of the present invention there is provided an appliance, wherein in that the shaft (2) is provided with a cavity.

According to a preferred embodiment of the first aspect of the present invention there is provided an appliance, wherein in that the cavity is a drilled-out cylinder.

According to a preferred embodiment of the first aspect of the present invention there is provided an appliance, which is a tool holder, wherein at least those parts of the surface (5) of the shaft (2) that are intended to be in contact with the manufacturing machine or a tool holder of a manufacturing machine holding said tool holder are provided with the vibration-damping material.

According to a preferred embodiment of the first aspect of the present invention there is provided an appliance, wherein the complete surface of the appliance is provided with the vibration-damping material.

According to a preferred embodiment of the first aspect of the present invention there is provided an appliance, wherein the vibration-damping material (4) surrounds the surface (5) of the shaft (2).

According to a preferred embodiment of the first aspect of the present invention there is provided an appliance, wherein the shaft (2) and the head (3) are two separate parts united through the vibration-damping material (4).

According to a preferred embodiment of the first aspect of the present invention there is provided an appliance, for use in a rotating cutting tool.

According to a preferred embodiment of the first aspect of the present invention there is provided an appliance wherein said rotating cutting tool is a milling cutter, slot mill or an end mill.

According to a preferred embodiment of the first aspect of the present invention there is provided an appliance for use with ceramic inserts, diamond inserts, cubic boron nitride (CBN) inserts, HSS (hiqh-speed steel) inserts or carbide (hard metal) inserts.

According to a preferred embodiment of the first aspect of the present invention there is provided an appliance wherein said appliance is a drill or a rotary file comprising a shaft provided with a vibration vibration-damping material.

According to a preferred embodiment of the second aspect of the present invention there is provided a method wherein said appliance is movable or immovable.

According to a preferred embodiment of the second aspect of the present invention there is provided a method wherein said ceramic material is precipitated as a thin layer on the surface of said appliance.

According to a preferred embodiment of the second aspect of the present invention there is provided a method wherein said ceramic material is precipitated as a thin layer on the surface of said appliance wherein said layer is from 1 μm to 1 cm, preferably from 1 μm to 1000 μm, most preferred from 50 to 500 μm.

According to a preferred embodiment of the second aspect of the present invention there is provided a method wherein said nano-dimensional cluster of said ceramic material has a size of from 0.5 to 100 nm.

According to a preferred embodiment of the second aspect of the present invention there is provided a method wherein said ceramic material is a metal nitride or metal oxide, preferably selected from the group consisting of $CN_x$, TiN, TiAlN, $Al_2O_3$ or mixtures thereof; most preferred $CN_x$ is used. The vibration damping materials may also be based on ceramics only, or on metals or on metal-ceramic composites. The following nano-structured ceramics may be used: $CN_x$—Carbon nitride, TiN—Titanium nitride, $Al_2O_3$—Aluminium oxide, nano-scaled multilayered structures (super lattices) that are arranged in a way so that there is an attachment to each other layers of different metals or ceramics, or metal and ceramics. Accordingly the preferred embodiment of the present invention relates to the carbon nitride—$CN_x$, titanium nitride—TiN, aluminium oxide—$Al_2O_3$ and/or composite materials arranged by these materials. The preferred material is $CN_x$. This material demonstrates properties that are typical for metal alloys as well as for viscoelastic polymers. It is well known fact that the above mentioned materials have perfect tribological properties and are widely used in technology in particular as hard coatings for cutting tools as well as decorative coatings. It was unexpectedly found that $CN_x$ layer applied between two fixed to each other machine parts (fixed joint) demonstrates remarkable damping capacity already at the layer thickness of 30-50 micrometers and has damping properties as good as viscoelastic polymers. The present invention also relates to as set out above composite materials that are arranged by viscoelastic layer, and by $CN_x$ or TiN constraining layer as well as to composites done by nano and micro layered meta-metal or metal-ceramics super-lattices. The nitrogen content in the material $CN_x$ is showed by "x" as the atomic percentage of 10 to 50%.

According to a preferred embodiment of the second aspect of the present invention there is provided a method wherein the precipitation of step b) is performed by using magnetron sputter deposition technology such as DC, RF, pulsed, high power pulsed, reactive coating or arc technology such as steered and not steered arc or chemical vapor deposition (CVD) technology such as RF, DC, low pressure, high pressure, plasma assisted, or physical vapor deposition (PVD)

technology or Plasma spray technology or a combination of said technologies; preferably PVD and CVD is used.

According to a preferred embodiment of the second aspect of the present invention there is provided a method wherein the precipitation of step b) is performed using Ar, N, $CH_4$ or $C_2H_2$, or CO, or $CO_2$ gas or a combination thereof.

According to a preferred embodiment of the second aspect of the present invention there is provided a method wherein the precipitation of step b) is performed at a temperature of said article or work piece from 50 to 1500° C., preferably at a temperature of from 50 to 400° C.

According to a preferred embodiment of the second aspect of the present invention there is provided a method wherein the applied damping material is a composite material arranged by multilayer structure that consists of alternated layers of metal or metal compounds of one kind and metal or metal compounds of another kind.

According to a preferred embodiment of the second aspect of the present invention there is provided a method wherein the applied damping material is a composite material arranged by multilayer structure that consists of alternated layers of metals and metal nitride.

According to a preferred embodiment of the second aspect of the present invention there is provided a method wherein the applied damping material is a composite material arranged by multilayer structure that consists of alternated layers of metals and metal oxide.

According to a preferred embodiment of the second aspect of the present invention there is provided a method wherein the applied damping material is a composite material arranged by two layer structure that consists of a viscoelastic layer and a carbon nitride layer, preferably said carbon nitride layer is a constraining layer.

According to a preferred embodiment of the second aspect of the present invention there is provided a method wherein the uniformity of thickness of vibration damping layer is from 0.1 to 10%.

According to a preferred embodiment of the second aspect of the present invention there is provided a method wherein the vibration damping layer in nano-dimensional cluster form has a number of sub-layers in a superlattice which is 10-10000, preferably 100-1000.

According to a preferred embodiment of the second aspect of the present invention there is provided a method wherein the precipitation of step b) is performed in a reactor, optionally provided with a target on the magnetron cathode in said reactor;
comprising a cathode and anode separated by a magnetic field, and by:
(a) providing so that the cathode provides a magnetron-like magnetic field in the reactor;
(b) placing an appliance in a chamber;
(c) introducing one or more carbon containing process gases and reactive gas into the chamber;
(d) energizing the process gas and reactive gas to form a plasma to decompose the process gas onto radicals and further to deposit carbon material on the appliance and ionize the reactive gas to increase the rate of nitrogen chemisorption to the carbon; and
(e) exhausting the gases after decomposition and chemisorption from the chamber.

According to a preferred embodiment of the second aspect of the present invention there is provided a method wherein the appliance is rotated at a speed of about 0.25 rpm.

According to a preferred embodiment of the second aspect of the present invention there is provided a method wherein the process gases is acetylene and/or methane and/or carbon oxide, and/or carbon dioxide and reactive gas is nitrogen, preferably the ratio between process gas and reactive gas is about 1/10-10/1, most preferred the ratio between acetylene and/or methane and nitrogen is about 50/50.

According to a preferred embodiment of the second aspect of the present invention there is provided a method wherein the pressure in the reactor is from $10^{-4}$ torr to 1000 torr, preferably from $10^{-3}$ torr to 10 torr.

According to a preferred embodiment of the second aspect of the present invention there is provided a method wherein the current amplitude is about from 1 to 1000 A, preferably 5-6 A, the pulse length is from about 10 μs to 10 s and the frequency is from about 0.1 to 10000 Hz.

According to a preferred embodiment of the second aspect of the present invention there is provided a method wherein the pulsed power is from about 100 W to 1 MW, preferably from about 1 kW to 3 kW.

According to a preferred embodiment of the second aspect of the present invention there is provided a method which combines CVD cracking process and PVD cracking hardware that is cathode having balanced or unbalanced magnetron like magnetic field.

According to a preferred embodiment of the second aspect of the present invention there is provided a method wherein the anode-cathode high current pulsed electric discharge is normal, or abnormal, or transition abnormal to arc glow discharge.

According to a preferred embodiment of the second aspect of the present invention there is provided a method wherein the strength of the magnetic field during the deposition is from 0.01 to 0.3 Tesla, preferably not above 300 Gauss.

According to a preferred embodiment of the third aspect of the present invention there is provided an appliance wherein said appliance is a tool holder, cutting insert, drill, rotary file, collet or mounting device.

The present invention accordingly also provides a shaft intended to be arranged in a tool holder of a manufacturing machine or directly in a manufacturing machine, a head on which a cutter is intended to be arranged and a vibration-damping material arranged such that the cutter is in contact with the manufacturing machine solely through the vibration-damping material wherein the vibration-damping material is a ceramic material. The tool holder is, in this way, not in direct contact with the manufacturing machine, and has thus the conditions required for damping vibrations, to a large extent.

Because of small thickness of the damping layers arranged by nano-structured materials any known conventional layers precipitation technologies may be used. Examples of these are as set out above, but are not limited to: Chemical vapour deposition (CVD) technology, Physical vapour deposition (PVD) technology, Arc technology, and Plasma spray technology. It was found that in order to decrease the work piece, i.e. tool holder, temperature by use of CVD and PVD technology for damping materials manufacturing and attaching it may be necessary to increase the plasma portion of the gas and solids vapour in flows streaming towards parts arranging joints. In the case of plasma approach the work piece temperature may be in the range below 400 degrees Celsius.

The method of the above preferred embodiment may have the precipitation of step b) performed by using an electric discharge of about 100 A, during about 20 ms-40 ms per pulse, a voltage of about 500 V, a temperature of from about 20° to about 200° C., preferably of from about 130 to about 170° C., and at a frequency of about 10 Hz.

Characteristic domains or granules dimension for the materials that are used currently for vibration damping is in the range of tenth of microns to hundreds of microns and corresponding thickness of the damping layers is in the range of millimeters up to tenth millimeters. Another advantage of the present invention is so that it was found that the thickness of the layers of the nano-structured materials on the tool holders mentioned above reveal high damping capacity in the range of tenth microns up to hundreds of microns. In practice it means that application of these above mentioned ceramic materials for vibration damping in already elaborated and used mechanical joints or do not require at all the earlier layer thickness.

Pulsed powerful discharges in crossed electric and magnetic fields (so called E×B discharges) is used in the method according to the third aspect of the present invention and this kind of electric discharges is used in a system comprising anode and cathode that are separated by magnetic field In particular the discharge electrodes can be arranged by anode and cathode having in the vicinity of cathode the magnetron-like magnetic field. The distinguished features of plasma technology are extremely high plasma reactivity, a very high deposition rate, superior adhesion and possibility to affect on plasmas by electric and magnetic fields.

The damping effect is thought to be the result of nano-structures formed within the ceramic material during the method according to the second aspect of the invention. However, this hypothesis is nothing which is to be regarded as binding in any way for the scope of the present invention. The tool holders obtained by the method according to the second aspect of the invention exhibit an enhanced ability to dampen mechanical oscillations. The enhanced damping properties of these materials are thought to be achieved through effective transformation of the mechanical energy into heat by friction between nano-scaled domains, or granules, or large molecules arranging materials. Ceramic materials could thus be efficiently used for vibration damping in work pieces, in particular in mechanical joints.

Damping can be used to avoid premature fatigue by attenuating amplitudes of oscillations and suppressing undesirable resonances. By applying a damping material to the subject structure, mechanical energy can be dissipated by converting it to heat energy.

In mechanical structure system, there exist contact stiffness and contact damping in the interface of two parts. They have a great effect on the behaviour, especially on the dynamic behaviour of the whole system. The interfaces often are the weakest chains in the whole mechanical structural system. Structural vibration is a major design problem and in most cases designers try to minimize vibration amplitudes in order to eliminate the danger of fatigue failure.

Any machine has a tendency to vibrate. It is common approach to deposit a layer between joined parts to damp the vibration. Most common the damping layer consists of viscoelastic material or resin. The present invention relates to other kinds of materials for damping. These are sub-nano and nano structured materials such as $CN_x$, TiN, TiAlN, and $Al_2O_3$. The preferred material is carbon nitride-$CN_x$. It was found that layers of these materials to be applied between joined machines parts, demonstrate effective transformation of mechanical (vibration) energy into heat already at the layer thickness of 10 micrometers.

Research on carbon nitride started in 1922. During many decades world wide efforts made to investigate the material properties. Main efforts are done to investigate tribological properties. So far the most $CN_x$ films produced contain 20-45 atomic % of nitrogen. The carbon nitride demonstrate very high elasticity (up to 85-90%) and hardness (40-60 GPa). The carbon nitride films can be synthesized at temperatures 50-600° C. See: D. Li, Y.-W. Chung, M.-S. Wong, and W.-D. Sproul, Tribology Transactions 37, 479 (1994), H. Sjöström et al., Thin Solid Films, 246 (1994) 103-109. It is well known fact that $CN_x$ films can be amorphous, amorphous matrix that containing crystalline clusters, and turbostatic-like films. Usually the carbon nitride film consists of different phases. The turbostatic microstructure can be described as random assembly of the basal structure units (flakes). A basal structure unit is schematically showed of FIG. 4. The basal structures are assembled in aggregates. The typical dimension of the aggregates and crystalline clusters incorporated into amorphous matrix are 0.5-10 nm. The distance between crystallites is in nanometers range too. It is obvious that such ultra-fine structure have to have extremely large surface between phases such as basal structure units, crystallites, and amorphous matrix.

Other materials having good tribological properties and nano-dimension structures are titanium nitride (TiN) and aluminum oxide ($Al_2O_3$) ceramics. The FIGS. 5 and 6 demonstrate it. FIG. 5 is a side view if cleaved TiN film obtained by Scanning Electron Microscope. As one can see the TiN film structure is columnar. The TiN layers where deposited by PVD technology. The $Al_2O_3$ has granular structure (see: O. Zywitzki, G. Hoetzsch, Surface and coating technology 76-77 (1995) 754-762). The characteristic width of column is about 50-100 nm. The height of columns is equal to film thickness. It is obvious that one can design sandwich-like structures. For example it can be Ti—TiN superlattices. The modern technologies allow to precipitates films having thickness about few nanometers.

As one can see the modern technology allows creation of the superlattices having thousands of layers and correspondently extremely large surface between layers and adjustable interface between them. The deposition time for Ti based superlattice is about few hours that are industrially reasonable.

Preferred features of each aspect of the invention are as for each of the other aspects mutatis mutandis. The invention is further described in the following examples in conjunction with the appended figures, which do not limit the scope of the invention in any way. Embodiments of the present invention are described in more detail with the aid of examples of embodiments and figures, the only purpose of which is to illustrate the invention and are in no way intended to limit its extent.

SHORT DESCRIPTION OF THE FIGURES

Figure 7:
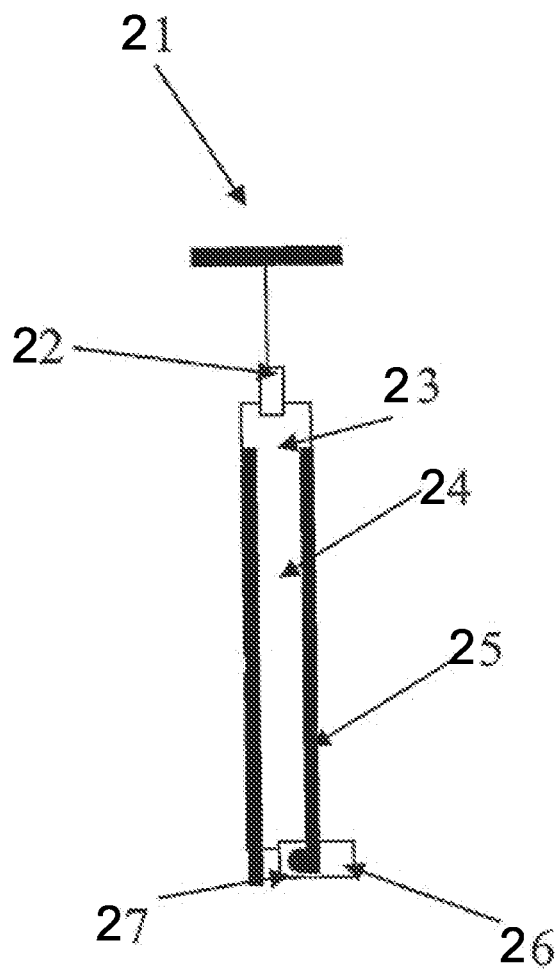
Figure 8:
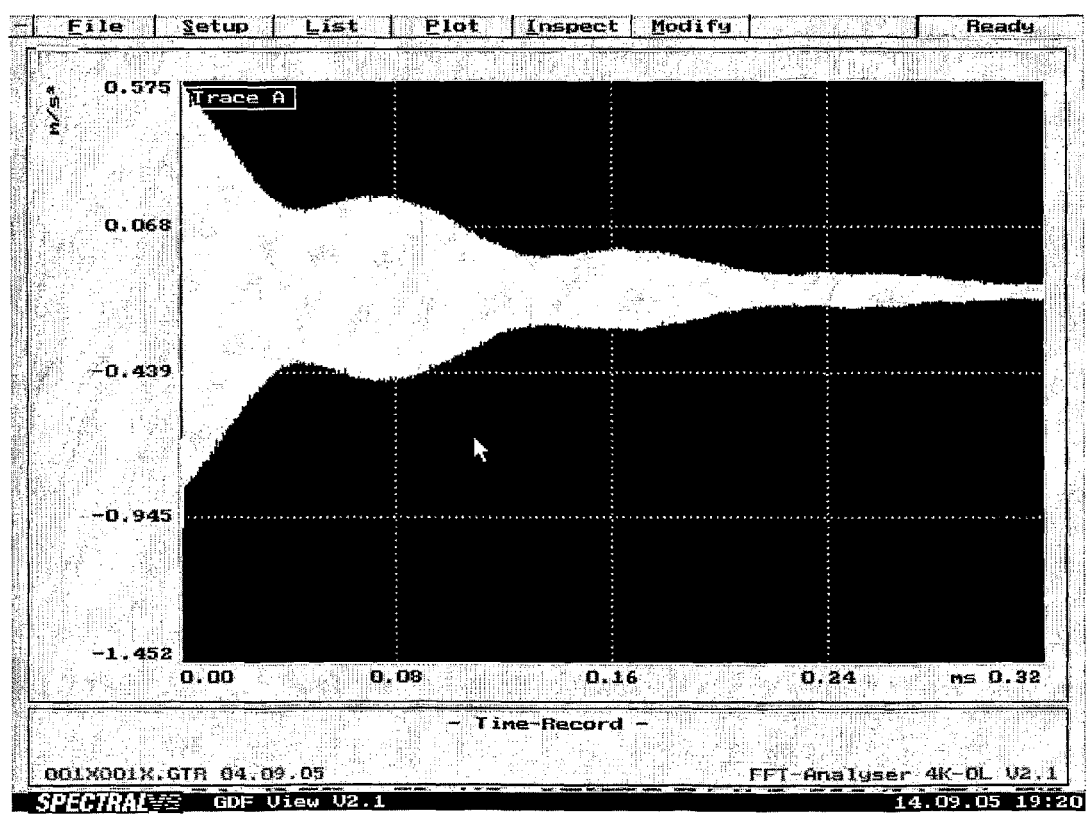
Figure 9:
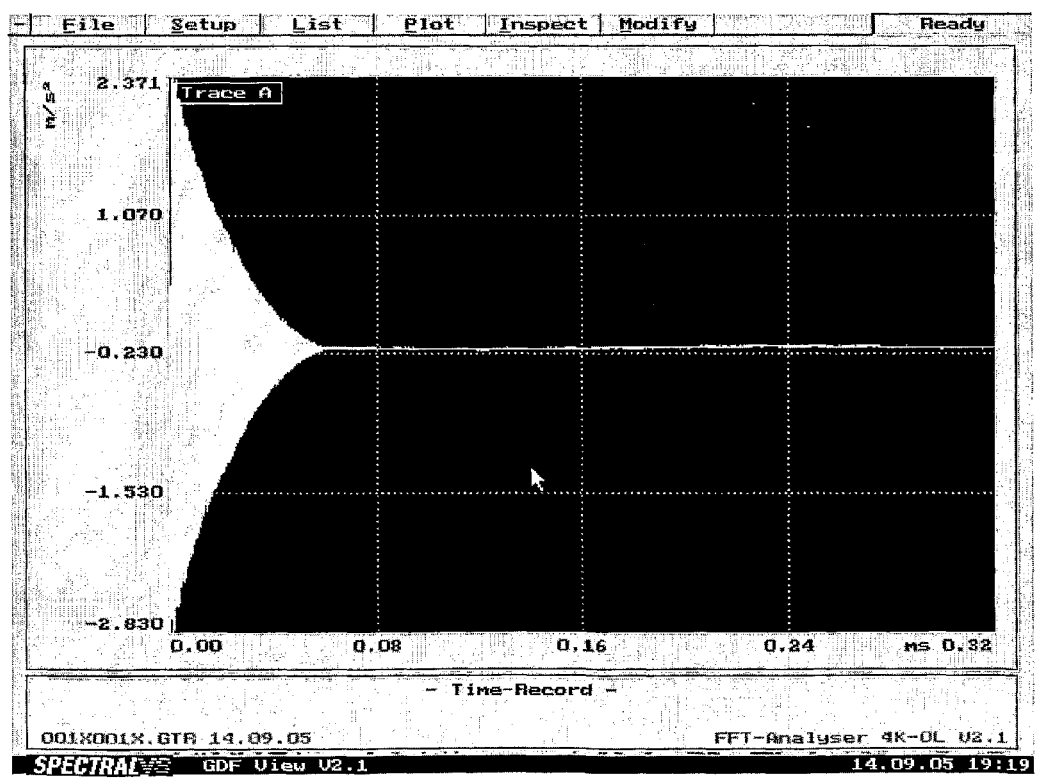
Figure 10:
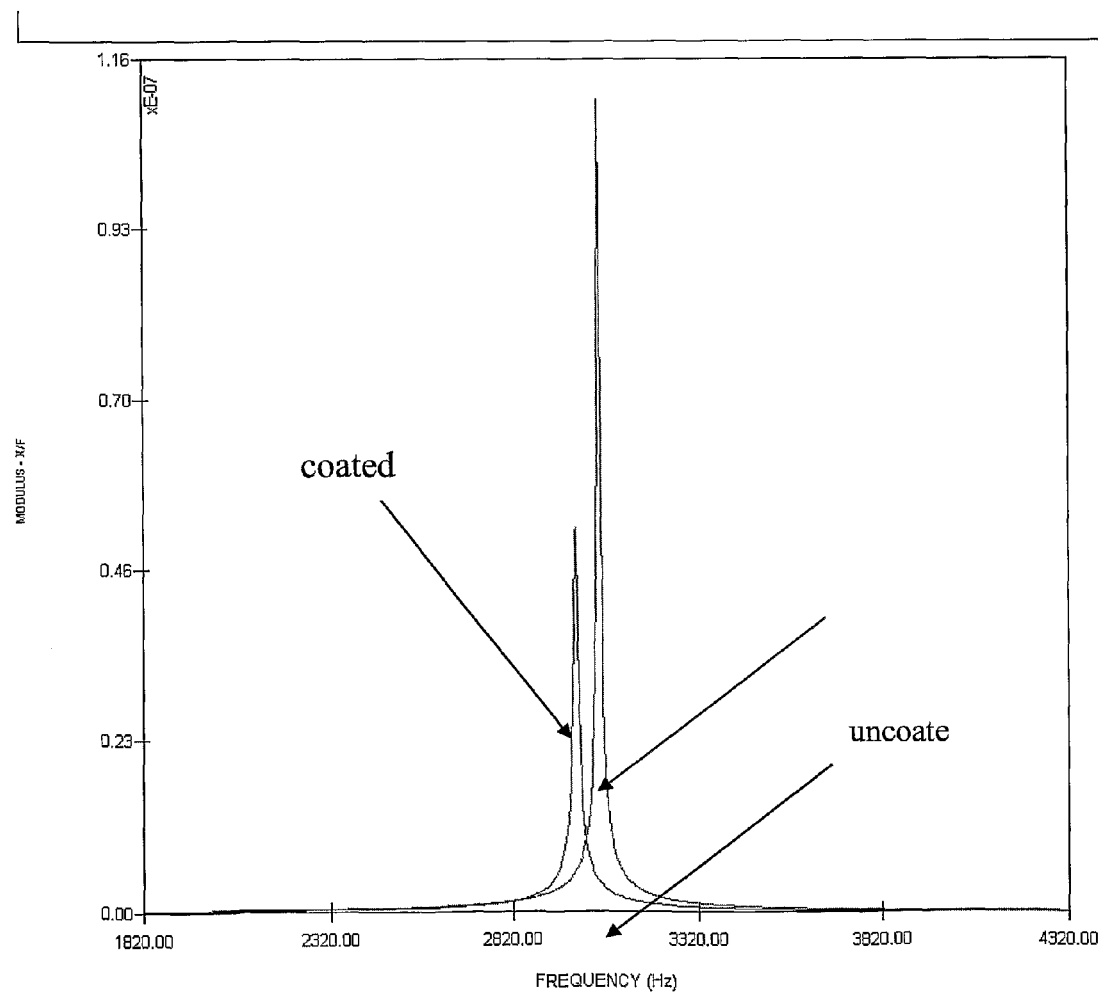

FIG. 7 is schematic presentation of how the work piece according to the second aspect of the invention was tested for vibration damping FIG. 8 is vibration amplitude decay after pulsed excitation. Non coated bar FIG. 9 is vibration amplitude decay after pulsed excitation. Coated bar FIG. 10 is vibration modal analysis.

Figure 11:
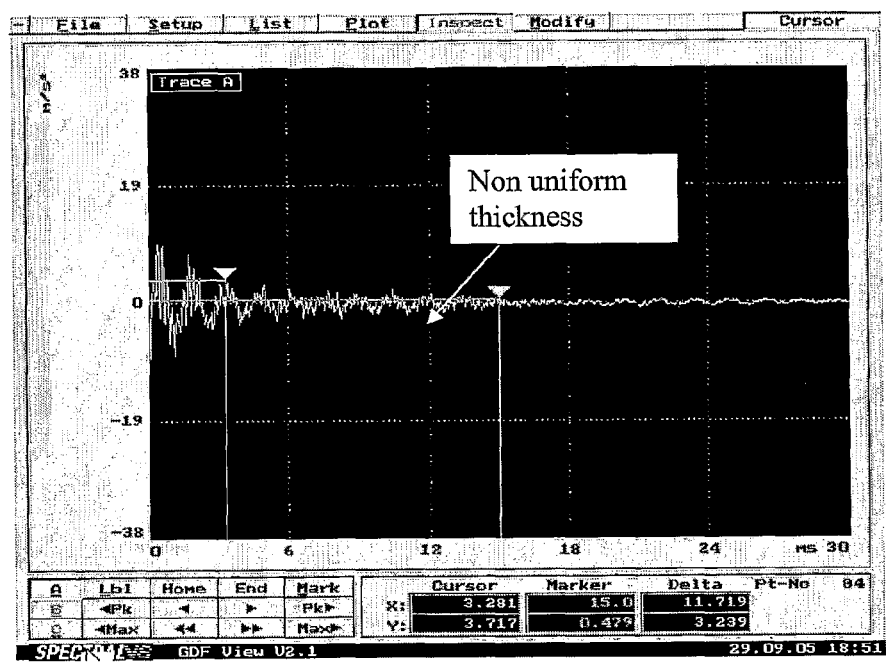
Figure 11:
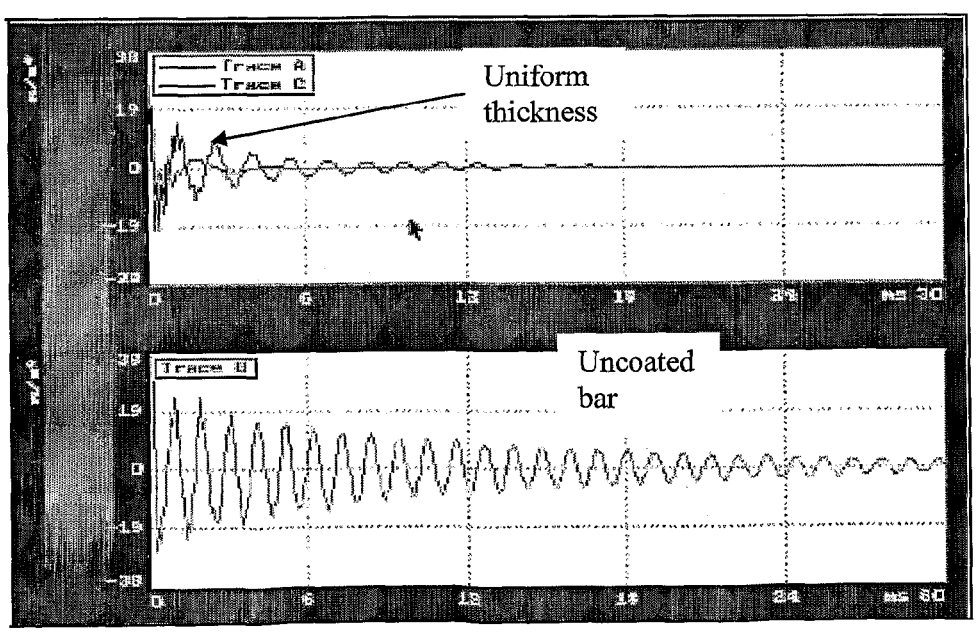
Figure 12:
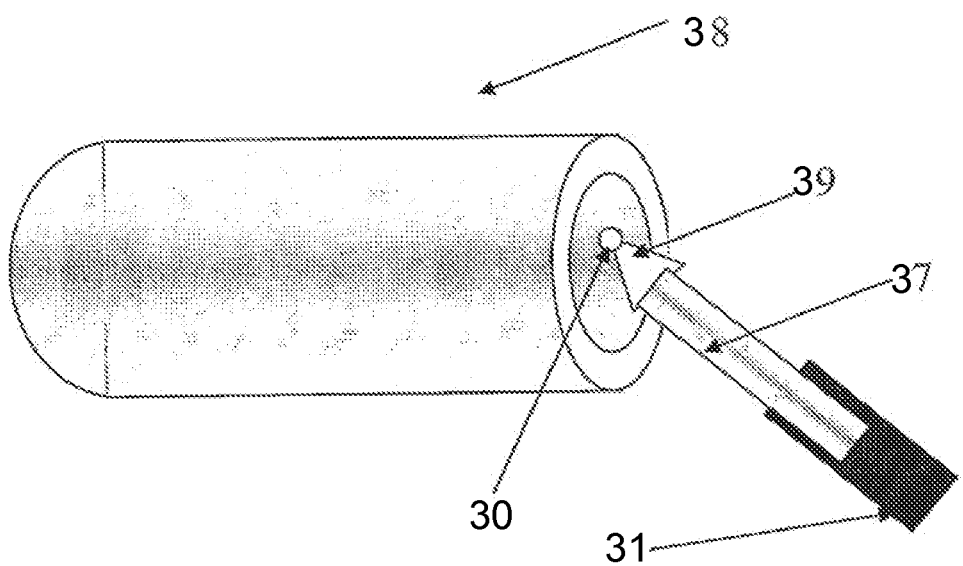

FIG. 11 is influence of non uniformity of damping layer thickness on vibration spectra and a schematic presentation of continuous vibration excitation FIG. 12 shows a further set up of the above work piece when measuring vibration damping.

Figure 13:
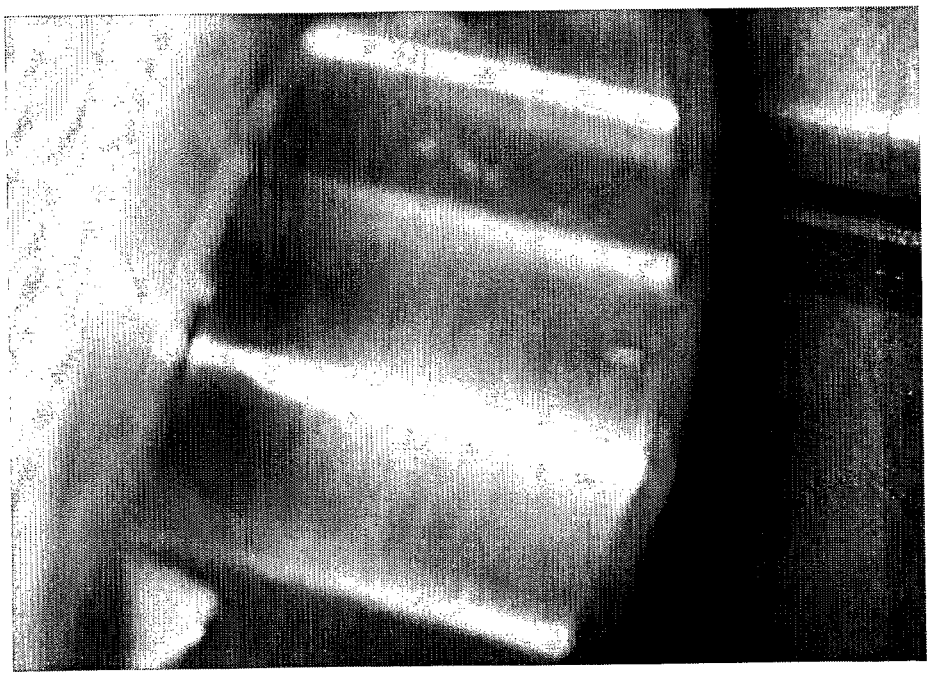
Figure 14:
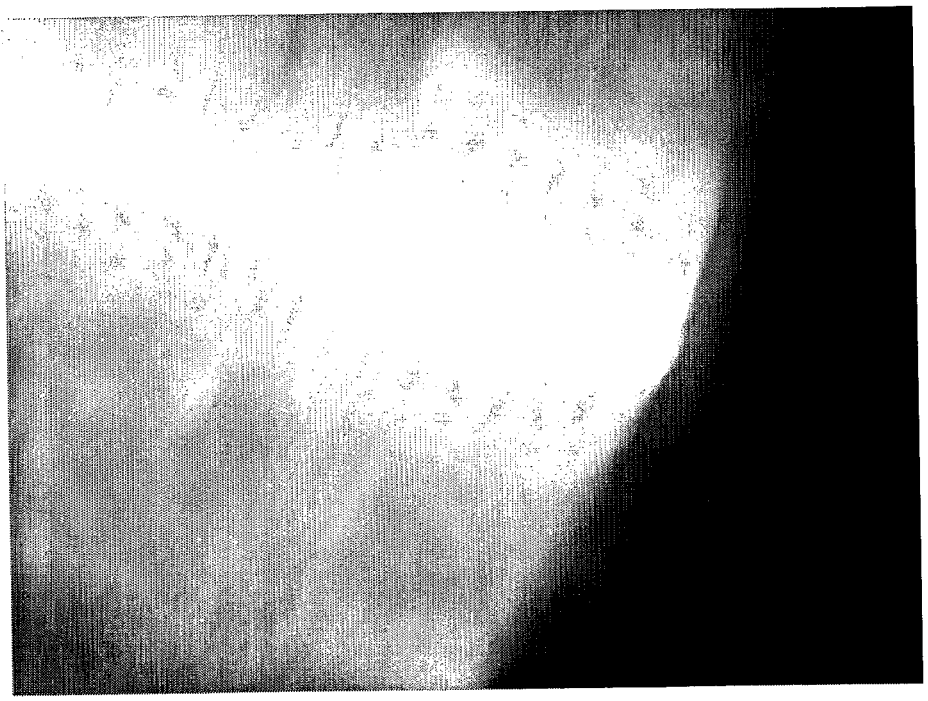
Figure 15:
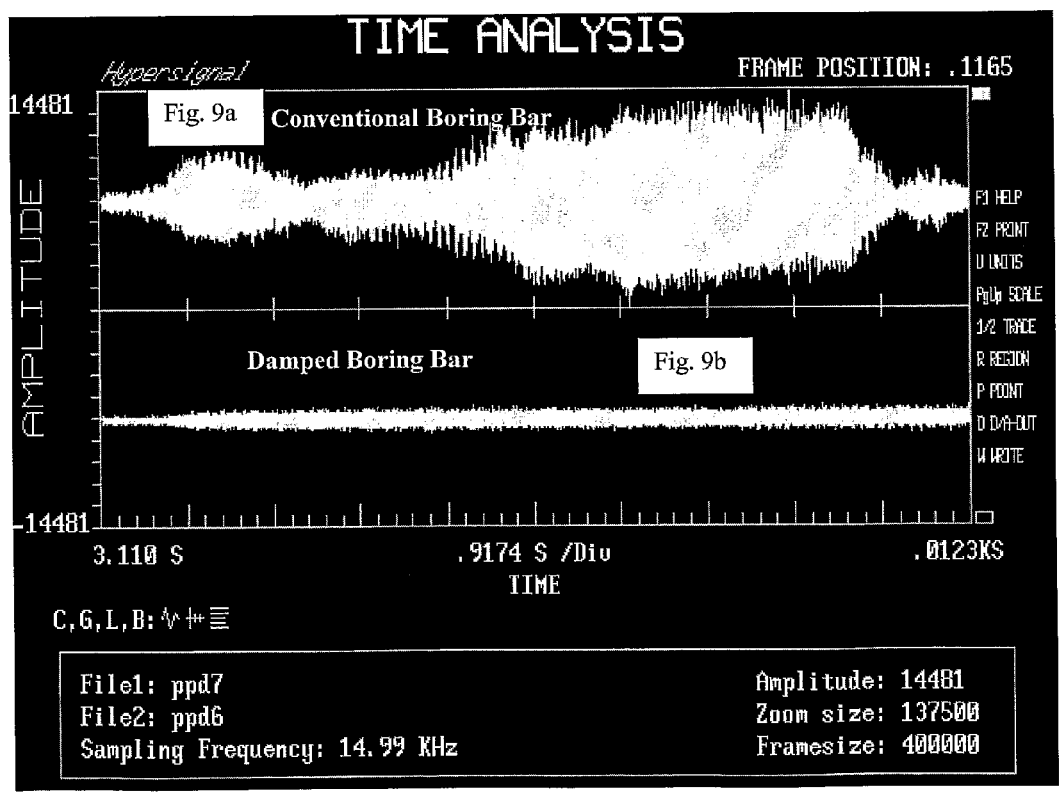

FIG. 13 is photograph of work piece surface after machining by non coated bar FIG. 14 is photograph of work piece surface after machining by coated bar FIG. 15 is sound amplitude by continuous vibration excitation of non-coated bar and sound amplitude by continuous vibration excitation of coated bar.

Figure 16:
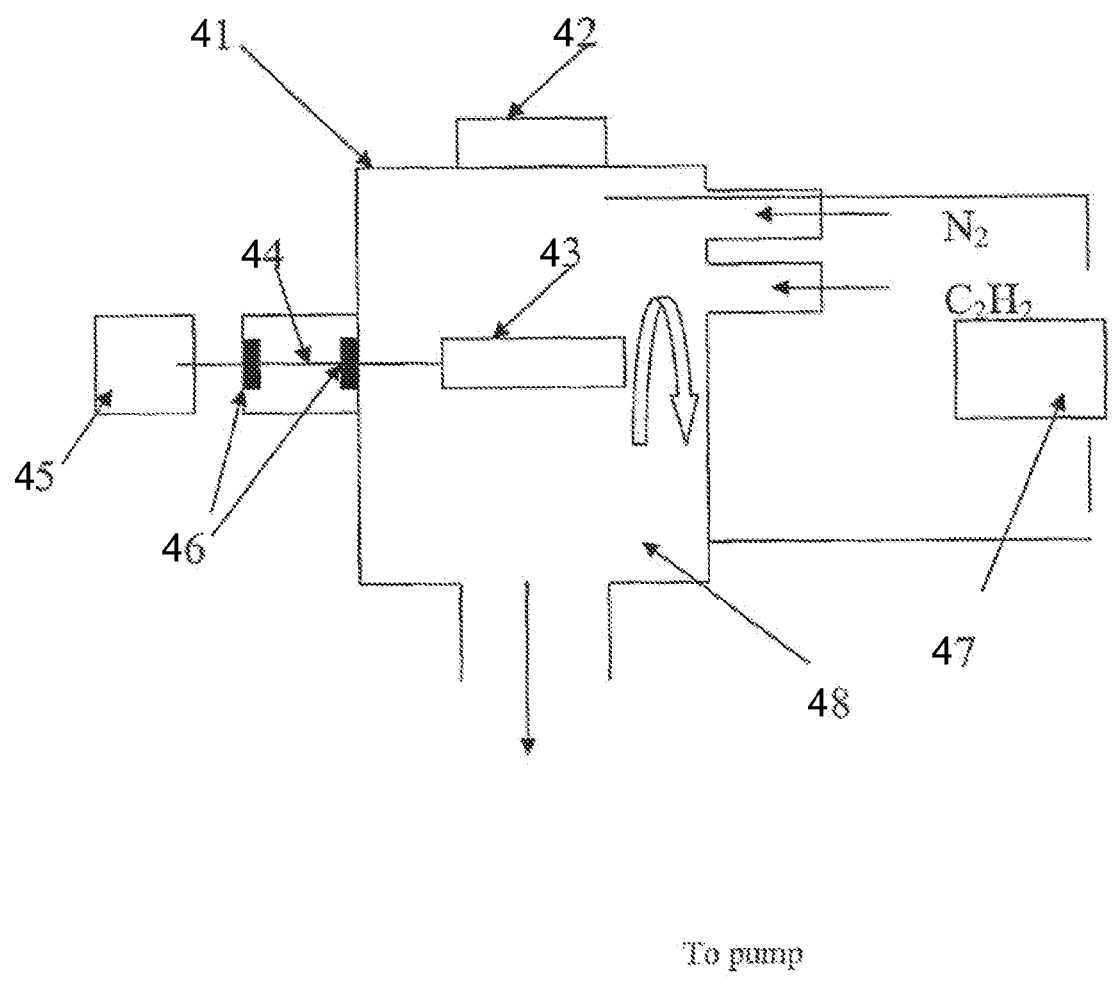

FIG. 16 shows the apparatus according to the twelfth aspect of the present invention which was used for manufacturing the above work piece.

Figure 17:
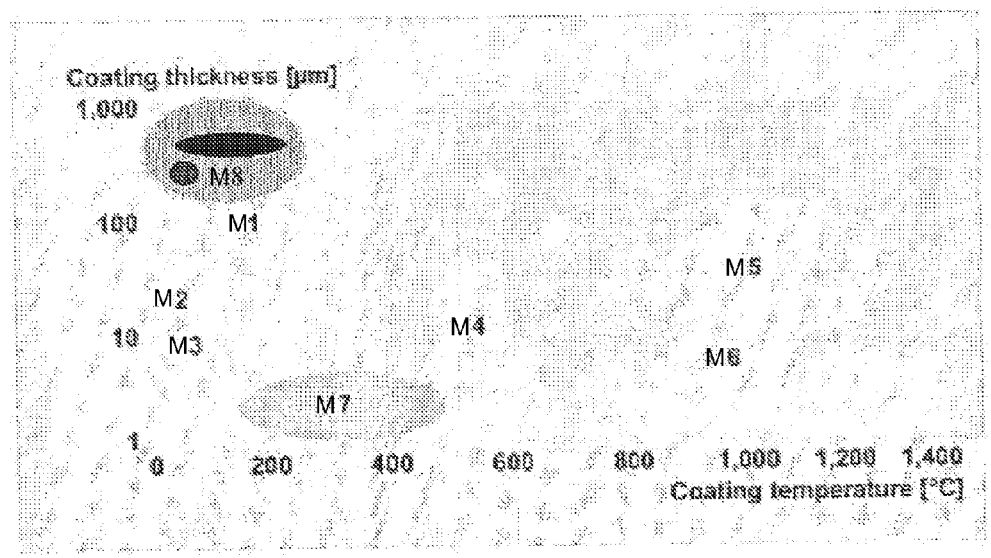
Figure 18:
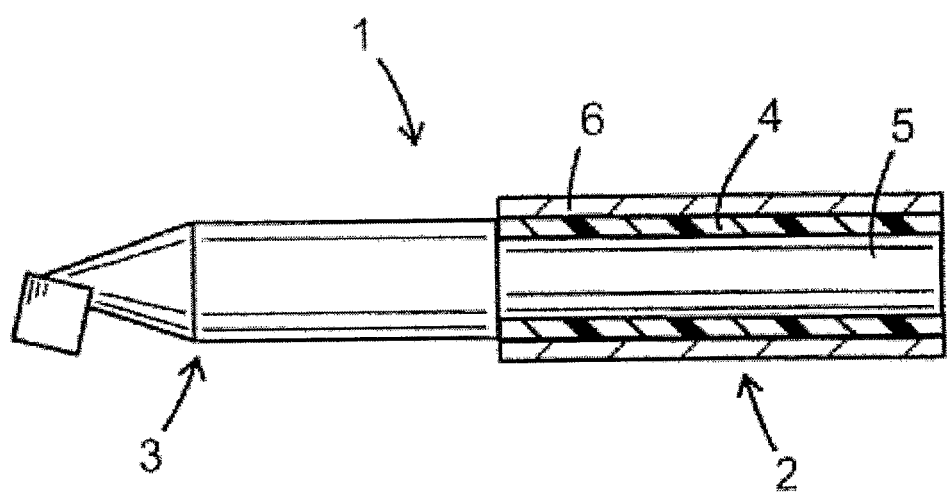

FIG. 17 shows a comparison between deposition methods, wherein nr 8 is the method according to the fourth aspect FIG. 18 shows a tool holder according to the first aspect of the present invention. With reference to FIG. 18, a first aspect of the invention is constituted by a tool holder 1, consisting of a shaft 2 and a head 3. A cutter is intended to be arranged on the head 3. The shaft 2 of the tool holder 1 is provided with a vibration-damping material 4 around its surface 5. A non-compulsory iron tube 6 is arranged around the material 4 intended to distribute more evenly the mounting forces when the tool holder 1 is attached to a manufacturing machine.

Figure 19:
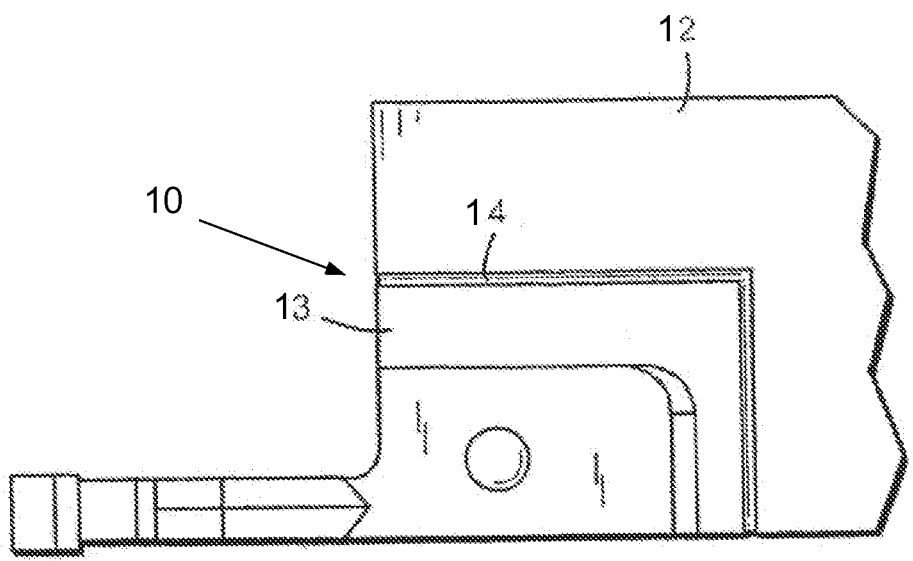

FIG. 19 shows a tool holder according to the first aspect of the present invention. With reference to FIG. 19, a further embodiment of the invention is constituted by a tool holder 10. The tool holder 10 is physically divided into two parts, a forward head 13 intended to accommodate a cutter, and a rear shaft 12 intended to be mounted into a manufacturing machine. The shaft 12 and the head 13 are separated from each other by a vibration-damping material 14. The vibration-damping material 14 may be arranged at any location on the tool holder between the attachment of the cutter into the front end of the tool holder and the region intended for mounting into the manufacturing machine. It is preferable that the vibration-damping material 14 is arranged at the front end in the manner that is shown in FIG. 19. The shaft 12 of the tool holder 10 is provided with a vibration-damping material in the form of a ceramic material covering surface on the surface of the tool holder as shown in FIG. 18 or between the shaft 12 and the head 13 as shown in FIG. 19.

Figure 20:
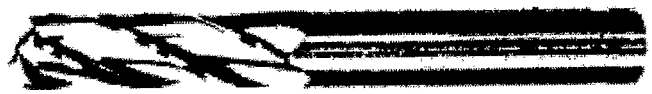
Figure 20:
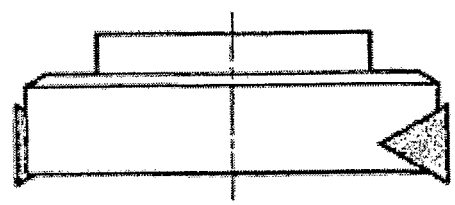
Figure 20:
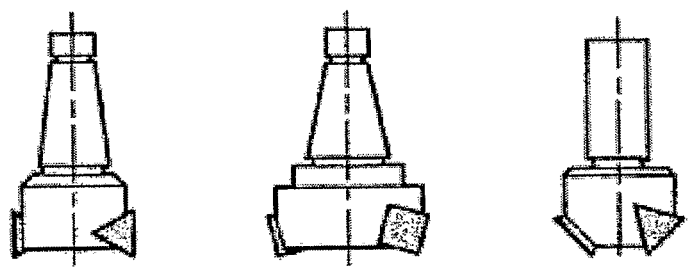
Figure 20:
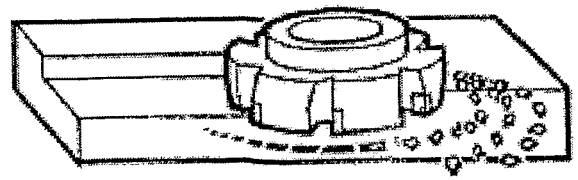

FIG. 20 shows: (a) a drill on which shaft the vibration damping material is provided, (b) (c) I, II, III a milling cutter in different designs, and (d) a milling cutter in use.

EXAMPLES

In the following examples the method according to the first aspect of the invention is further illuminated.

Example 1

The experiment was directed to application of nano-structured materials which were shown to drastically damp vibration of cutting tools. The results of initial feasibility study face were very positive and are given below. The technology that was used for this nano-structured materials synthesis and precipitation was the use of powerful discharges in crossed electric and magnetic fields Deposition and Evaluation of $CN_x$ Damping Coatings 1. The Method and Procedure (PPD)

The basic pressure was $10^{-6}$ Torr. The operating gases were Acetylene and Nitrogen. Operating pressure was $10^{-2}$-$10^{-3}$ Torr. The acetylene/nitrogen proportion was 50/50.

Power supply was a pulsed current generator. Current amplitude is 5-750 A. Pulse length was 5 ms-30 µs. Pulses frequency was 50 Hz. Average power was 1 kW. Pulsed power was 2-300 kW. The normal, abnormal, and glow to arc transition discharges where used.

The hard ware was typical for magnetron sputtering hard ware (PVD technology). The cracking of gas acetylene is typical gas for CVD technology. The deposition rate for PVD with mixture argon+nitrogen was 0.5 micrometers per hour. The deposition rate for CVD with mixture acetylene+nitrogen (CVD) was 15-20 micrometers per hour and is 30-40 times higher that for PVD. It means that for acetylene the deposition rate is 15-20 micrometers per hour per kilowatt. It means that CVD process had the main influence on deposition rate. More than 90% of the deposited carbon came from the acetylene and the rest of the deposited carbon came from the carbon cathode having magnetron like magnetic field. One can thus say that the present method according to the first and fourth aspects is a CVD process provided by PVD hardware or PVD technique is used as cracking cell to provide the CVD process. The anode was the vacuum vessel (processing chamber).

The deposition was done in two steps:
1. Deposition of ground layer 30 micrometers thick
2. Deposition of the upper layer 20 micrometer thick Between the steps the work piece was cooled down and tested for vibration damping.

2. Testing of PPD Boring Bars

1. Method

Boring bars coated by PPD technology were tested by help of experimental modal analysis (EMA). The results were compared with non-coated bar.

The measurements were performed in three steps:
1. measurement on uncoated bar
2. measurement on PPD-coated bar with 30☐
3. measurement on PPD-coated bar with 30☐+20 ☐

The transversal section of boring bars was circular. Therefore the bars were clamped in a mechanical holder developed at KTH, SPANO. The length of the bars is 250 mm.

The bars had been clamped on a length of 55 mm. The overhung length was 195 mm.

The dynamic performance of the bars was compared based on the following parameters:

Dynamic stiffness,

Damping

Static stiffness

Mode shapes

The modal analysis was performed in 7 nodes by hammer excitation. The parameters were calculated as average of 5 values.

3. Results

For the conventional, non-coated bar the EMA showed the following

Eigenfrequency: 552 Hz,

Dynamic stiffness: 63.59 m/s²/N

For 30☐ PPD bar:

Egenfrequency: 513 Hz,

Dynamic stiffness: 53.46 m/s²/N

For 50☐ PPD bar:

Egenfrequency: 465 Hz,

Dynamic stiffness: 29.65 m/s²/N

Figure 1:
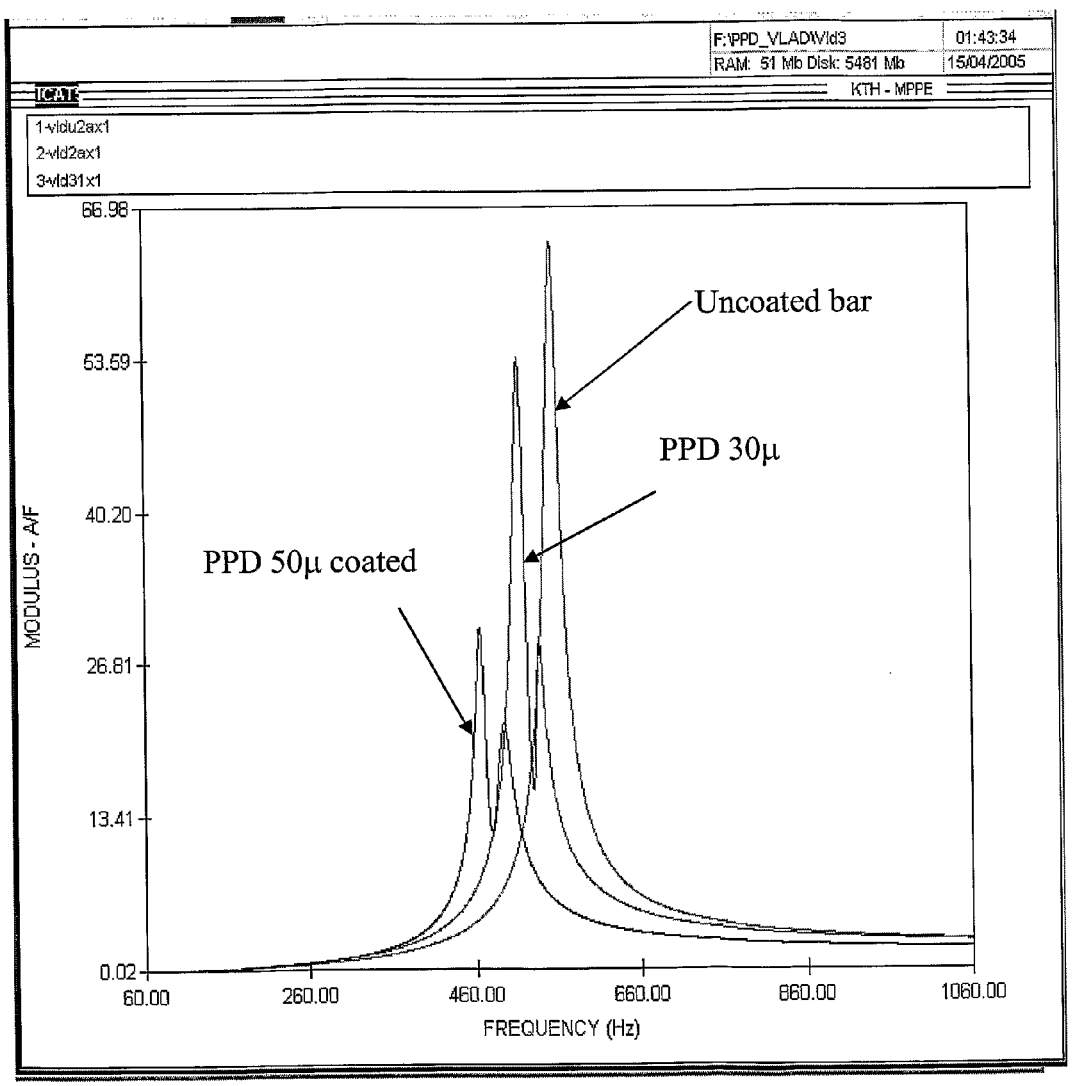
FIG. 1 shows modal analysis

These results are presented in FIG. 1.

For PPD bars it is apparently so that a second mode is appearing at frequency close to the first mode.

Damping ratio

Undamped bar: 1.19%

PPD-30☐: 1.66%

PPD-50☐: 2.75% and 4.11%

Figure 2:
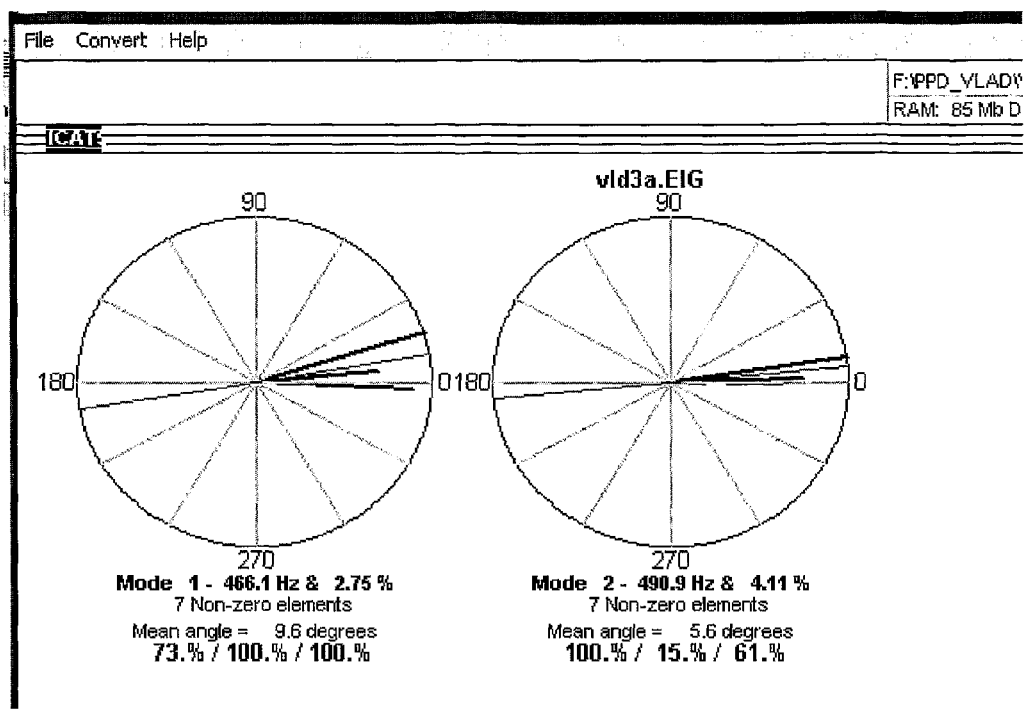
FIGS. 2 and 3 shows results from the tests in the example below.
Figure 3:
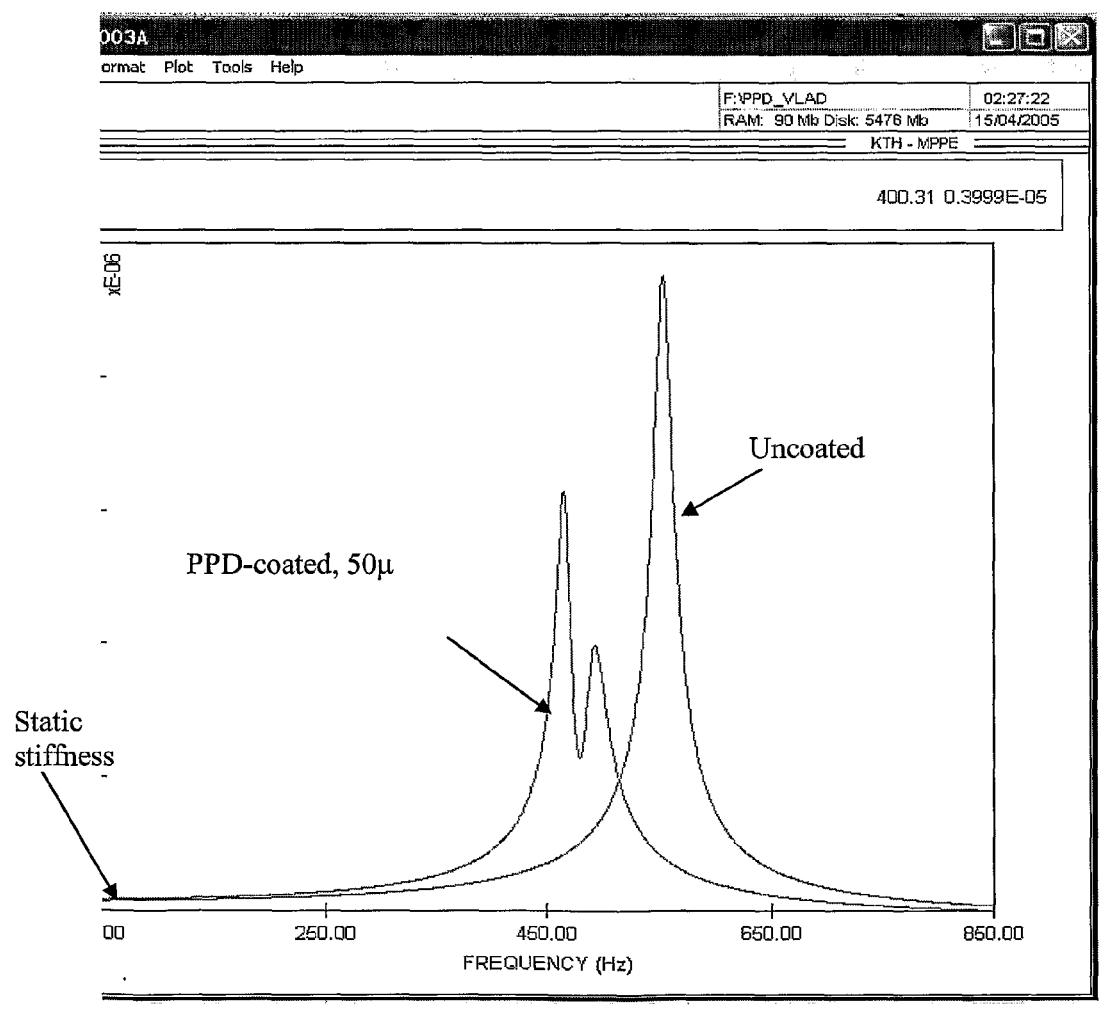
Figure 4:
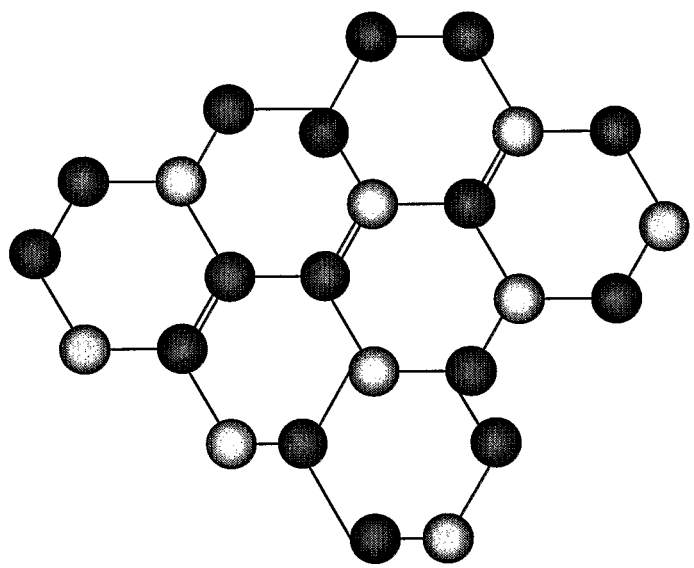
FIG. 4 is schematic presentation of basal $CN_x$ planes.
Figure 5:
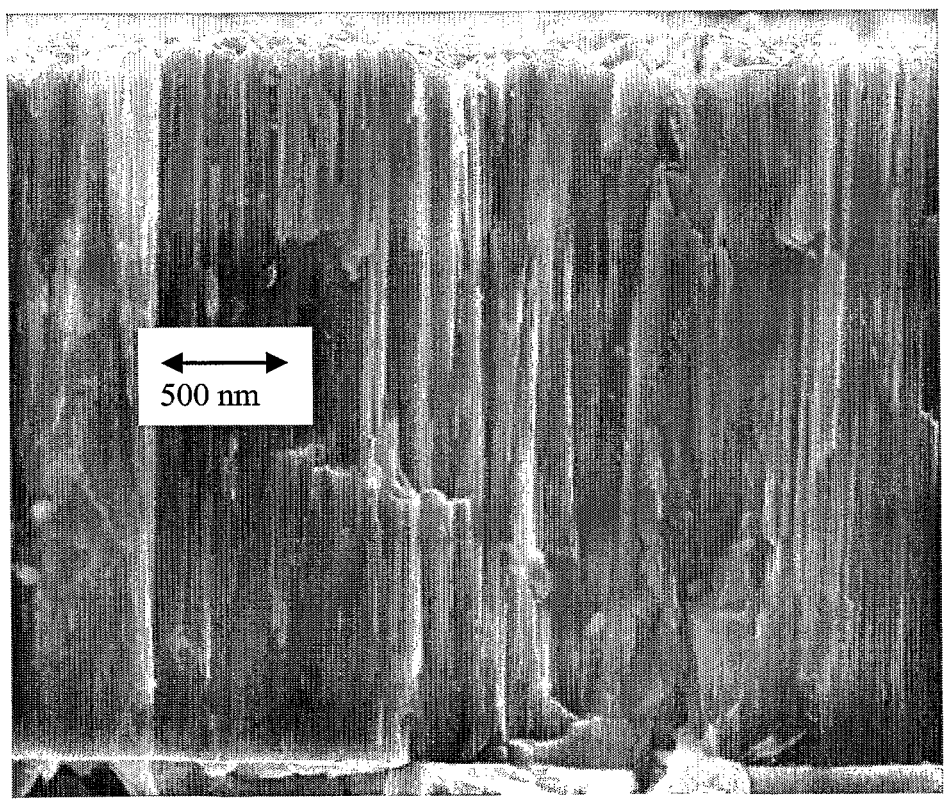
FIG. 5 is micrograph of columnar nano-structure of TiN ceramic.
Figure 6:
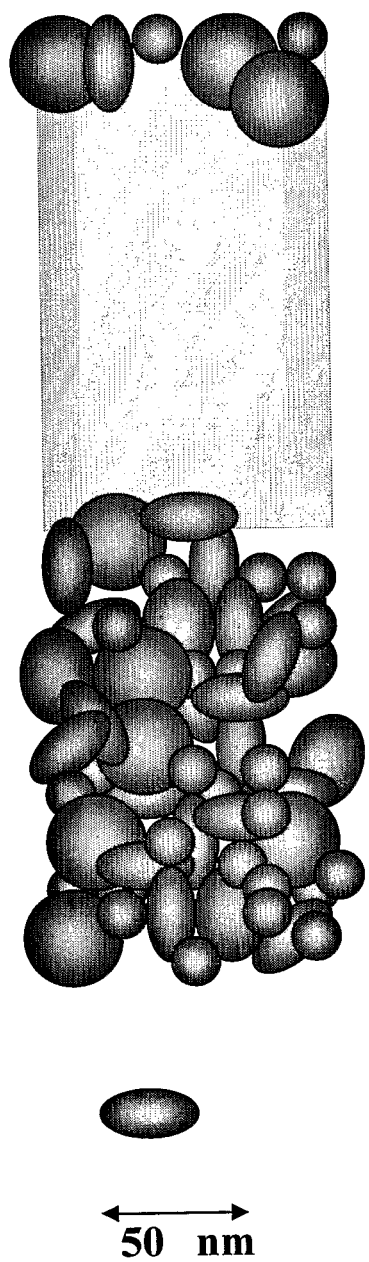
FIG. 6 is schematic presentation of granular nano-structure of $Al_2O_3$ ceramic.

From FIGS. 2 and 3 it can be observed that the static stiffness between the two
FRF results is not changing significant. This result demonstrates the advantage using hard coatings instead of VE-materials.

4. Conclusion

The $CN_x$ ceramics (which is thought to be Fullerene-like) may be used for hard elastic vibration damping coatings. The deposition rate can be as high as 50 micrometers per hour that is industrially acceptable value for the batch coating machine design. The estimated thickness of the efficiently damping layer is about 200 micrometers that results in 5-hour deposition period. There is no limitation in principal for the number of work pieces that can be loaded into batch coating machine. The only limit is the geometrical factor namely machines dimensions. For example for 1000 work pieces loaded into machine the equivalent processing period of one of them may be 0.3 min.

The pulsed high current plasma deposition principle results in good adhesion of the deposited film to the steel work piece. The 50 micrometers thick layer was not delaminated during the vibration damping tests.

It was thus discovered that Carbon nitride layers attached to a cutting tool in part of the tool clamped in tool holder significantly damped the tool vibration and by this way improved the precision of the processing work pieces surface. Another important effect of vibration damping of cutting tools by work pieces machining is the possibility to increase work piece revolution without destructive vibration. It results in an increase of the production efficiency.

A further important property of the work pieces above is their rigidity that allows joining of the mechanical parts without addition of a rigid layer that is necessary in the case of viscoelastic polymers that commonly are used as damping material.

Another important property of the work pieces above is high temperature resistance up to several hundreds of degrees of Celsius. The method according to the second aspect of the present invention allows using these ceramics in joints available in turbines and jet engines.

Example 2

The method of vibration damping that is used in present invention can also be demonstrated by TiN layers. At now in industry TiN is used as hard coating of cutting inserts. For it TiN is deposited on top of cutting insert that operates against of machining work piece. Cutting insert is joined (bolted) to insert holder. Insert and holder are arranging the cutting tool. It is common phenomena that cutting tool vibrates during work piece machining. It is one method of the present invention that vibration damping TiN layer or a layer of other materials mentioned above earlier is deposited onto bottom surface of insert at the interface between the insert and the tool holder. As well for the vibration damping TiN can be deposited on back side of a cutting tool in an area where the tool is clamped to turning or milling machines.

It was found that above mentioned nano-structured materials have good damping properties. The illustration of it is done further on the example below on the carbon nitride.

FIG. 7 is schematic presentation of vibration excitation of vibration. Here 21 is the platform where tested cylindrical bar is fixed by elastic cable 22 and cable-bar fixing point is 23. The bar is showed as 24. 25 is vibration damping layer. For the damping layer deposition the chemical vapor deposition was used. The nitrogen and acetylene were the operating gases. Point of shock vibration excitation is showed as 26. The vibration detector was fixed in the point 27. The bar was manufactured from tool steel. After manufacturing the bar was tempered. The bar length was 220 mm and diameter is 31.4 mm. The vibration damping material was 300 micrometers thick carbon nitride layer, therefore integral diameter of coated bar was totally 32 mm.

The vibration damping was detected as decay of vibration amplitude in bar after shock excitation. The vibration amplitude is showed as function of time that was measured by acceleration detector. The results are showed at FIGS. 8 and 9. It was found that decay constant is 0.1 ms for uncoated bar and 0.02 ms for coated bar. The result was compared with damping layer fabricated from viscoelastic material. If was found that carbon nitride as damping material is as efficient as viscoelastic polymer. In the FIG. 10 the resonance of coated and not coated bar are showed. The resonance frequency of uncoated bar was 2985 Hz. The resonance frequency of coated bar was 3110 Hz. The temperature of the bar during damping layer precipitation was below 100° C. Low precipitation temperature results in the fact that the fundamental natural frequency before and after precipitation is almost equal, e.g. the bar was not annealed during the precipitation. Small difference may be explained by the difference in diameter of coated and uncoated bar. This is important results which clearly shows that the vibration damping layers can by precipitated onto steel work pieces/components/parts (cutting tools, gears, bearings) without changing their properties. Moreover low temperature may allow to apply carbon nitrides layers as a constrain layer on top of viscoelastic layers.

It was found that efficiency of vibration damping depends not only on material but also on thickness uniformity of damping layer. It is demonstrated by FIG. 11. The bar was clamped. The clamp length was 80 mm. On the clamp length the thickness of damping layer varied at 30% along bar axe. The impulse force excitation was used. The layer-non-uniformity results in appearance of vibration of high frequency which are overlapping the fundamental natural frequency.

In FIG. 12 the scheme on continuous vibration excitation is shown. The bar 37 was clamped in clamp 31 of turning machine. From other side the cutting insert 39 was bolted to a bar. The steel work piece 38 was clamped in a spindle of a turning machine. The work piece machining point is 30. The parameters of machining were chosen so that intensive vibration was excited by uncoated bar. The vibration of joint work piece-cutting tool was registered by microphone as sound producing during work piece manufacturing. It was found that damping layer is not destroyed by hard clamping characteristic to clamp the cutting tools. It was found that bar coated by 300 micrometers carbon nitride layer does not excite vibration at all by the same machining parameters. It is demonstrated by FIGS. 15 and 14. In FIG. 15 the amplitude of sound is reflected. In the FIGS. 13 and 14, FIG. 13 corresponds to coated bar and FIG. 14 corresponds to uncoated bar. This result clearly shows that by applying carbon nitride layers to cutting tools one can or increase the smoothness and accuracy of the work piece surface by the same machining speed or increase production capacity by increasing the machining speed because of it is not limited by disruptive vibration. Another important result of vibration and corresponding noise damping is significant improvement of working conditions of the personnel. Another important result of vibration damping is the increase of life-time of cutting inserts. It is well known fact that characteristic life-time of inserts by processing of hard metals is about 15 min. It is in particular because of inserts vibration that is similar to periodical high frequency shocks. By applying vibration damping layer between insert and insert holder (fixed joint) one can decrease or eliminate the shocks and by this way increase the inserts life time.

The set-up used for manufacturing the above work piece, i.e. tool holder, was made up by the following components (See also FIG. 16 where the numbers are indicated)
41—vacuum vessel (processing chamber)
42—Magnetron sputtering cathode (80 mm planar, circular) with carbon target
43—Bar
44—bar holder
45—Electromotor
46—vacuum sealing
47—Power supply
48—direction of the bar rotation The basic pressure was $10^{-6}$ Torr. The operating gases were Acetylene and Nitrogen. Operating pressure was $10^{-2}$-$10^{-3}$ Torr. The acetylene/nitrogen proportion was 50/50.

Power supply was a pulsed current generator. Current amplitude was 5-750 A. Pulse length was 5 ms-30 µs. Pulses frequency was 50 Hz. Average power was 1 kW. Pulsed power was 2-300 kW. The voltage was 10 kV and 1 kV in average. The work piece, that was deposited, was rotated at a speed of about 0.25 rps. The normal, abnormal, and glow to arc transition discharges where used.

The hard ware was typical for magnetron sputtering hard ware (PVD technology). The cracking of gas acetylene is a typical gas for CVD technology. The deposition rate for PVD with mixture argon+nitrogen was 0.5 micrometers per hour. The deposition rate for CVD with mixture acetylene+nitrogen (CVD) was 15-20 micrometers per hour and is 30-40 times higher that for PVD. It means that for acetylene the deposition rate is 15-20 micrometers per hour per kilowatt. It means that CVD process had the main influence on deposition rate. More than 90% of the deposited carbon came from the acetylene and the rest of the deposited carbon came from the carbon cathode having magnetron like magnetic field. One can thus say that it is CVD process provided (realized) by PVD hardware or PVD technique is used as cracking cell to provide the CVD process. The anode was the vacuum vessel (processing chamber).

Also a comparison was made when using different deposition methods and the result is reflected by FIG. 17. It was shown that hybrid method of pulsed plasma deposition had almost industrial deposition rate. It is demonstrated by FIG. 17. The item M1-M7 corresponds to conventional methods, and M8 is PPD (see list below). The smallest circle is already achieved layer thickness and temperature. As one can see it is outstanding result. The oval portion above said circle corresponds to an industrial coating machine.
M1 Plasma spraying
M2 Electrolytic and chemical deposition
M3 Phosphating
M4 Nitriding (white layer)
M5 Boronising
M6 CVD
M7 PVD, PACVD
M8 New hybrids PVD+PACVD technology, i.e. one aspect of the present invention Various embodiments of the present invention have been described above but a person skilled in the art realizes further minor alterations, which would fall into the scope of the present invention. The breadth and scope of the present invention should not be limited by any of the above-described exemplary embodiments, but should be defined only in accordance with the following claims and their equivalents. For example, any of the above-noted methods can be combined with other known methods. Other aspects, advantages and modifications within the scope of the invention will be apparent to those skilled in the art to which the invention pertains.

The invention claimed is:

1. An appliance for chip removal applications comprising a layer of a vibration-damping material in an interface between two parts of the appliance,
    wherein the vibration-damping material is a ceramic material comprising carbon nitride arranged by nano-dimensional cluster form,
    wherein the layer has a thickness of 1 µm to 1 cm,
    wherein the appliance comprises a tool holder comprising:
        a shaft intended to be arranged in a manufacturing machine or in a tool holder of a manufacturing machine; and
        a head on which a cutter is intended to be arranged,
    wherein the surface of the shaft in contact with the manufacturing machine or tool holder of a manufacturing machine holding said tool holder is provided with the vibration-damping material such that the cutter is in contact with the manufacturing machine solely via the vibration-damping material, and
    wherein the applied damping material is a composite material arranged by multilayer structure that consists of alternated layers of metal or metal compounds of one kind and metal or metal compounds of another kind.

2. An appliance according to claim 1 wherein said ceramic material is present as a layer on the surface of said appliance wherein the thickness of said layer is from 50 µm to 1 cm.

3. An appliance according to claim 1 wherein said nanodimensional cluster of said ceramic material has a size of from 0.5 to 100 nm.

4. An appliance according to claim 1 wherein the applied damping material is a composite material arranged by multilayer structure that consists of alternated layers of metals and metal nitride.

5. An appliance according to claim 1 wherein the applied damping material is a composite material arranged by multilayer structure that consists of alternated layers of metals and metal oxide.

6. An appliance according to claim 1, wherein said material is present only on surfaces of said tool holder in contact with a cutting edge, cutting insert and/or on said surface which is to be in contact with the manufacturing machine holding said tool holder.

7. An appliance according to claim 1, wherein the shaft is provided with a cavity.

8. An appliance according to claim 7, wherein the cavity is a drilled out cylinder.

9. An appliance according to claim 1, wherein the complete surface of the tool holder is provided with the vibration-damping material.

10. An appliance according to claim 1, wherein the vibration-damping material surrounds the surface of the shaft.

11. An appliance according to claim 1, wherein the shaft and the head are two separate parts united through the vibration-damping material.

12. An appliance according to claim 1 in a rotating cutting tool.

13. An appliance according to claim 12 wherein said rotating cutting tool is a milling cutter, slot mill or an end mill.

14. An appliance according to claim 1 in combination with a ceramic insert, a diamond insert, a cubic boron nitride insert, a HSS (high-speed steel) insert or a carbide insert.

15. An appliance according to claim 1 wherein said appliance is part of a drill or a rotary file comprising the shaft provided with the vibration damping material.

16. An appliance according to claim 1 wherein the uniformity of thickness of the vibration damping layer is from 0.1 to 10%.

17. An appliance according to claim 1 wherein the vibration damping layer in nano-dimensional cluster form has a number of sub-layers in a superlattice where the number of layers is from 10-10000.

18. An appliance for chip removal applications comprising a layer of a vibration-damping material in an interface between two parts of the appliance,
   wherein the vibration-damping material is a ceramic material comprising carbon nitride arranged by nano-dimensional cluster form,
   wherein the layer has a thickness of 1 μm to 1 cm,
   wherein the appliance comprises a tool holder comprising:
      a shaft intended to be arranged in a manufacturing machine or in a tool holder of a manufacturing machine; and
      a head on which a cutter is intended to be arranged,
   wherein the surface of the shaft in contact with the manufacturing machine or tool holder of a manufacturing machine holding said tool holder is provided with the vibration-damping material such that the cutter is in contact with the manufacturing machine solely via the vibration-damping material, and
   wherein the uniformity of thickness of the vibration damping layer is from 0.1 to 10%.

19. An appliance according to claim 18 wherein the applied damping material is a composite material arranged by two layer structure that consists of a viscoelastic layer and a carbon nitride layer.

20. An appliance for chip removal applications comprising a layer of a vibration-damping material in an interface between two parts of the appliance,
   wherein the vibration-damping material is a ceramic material comprising carbon nitride arranged by nano-dimensional cluster form,
   wherein the layer has a thickness of 1 μm to 1 cm,
   wherein the appliance comprises a tool holder comprising:
      a shaft intended to be arranged in a manufacturing machine or in a tool holder of a manufacturing machine; and
      a head on which a cutter is intended to be arranged,
   wherein the surface of the shaft in contact with the manufacturing machine or tool holder of a manufacturing machine holding said tool holder is provided with the vibration-damping material such that the cutter is in contact with the manufacturing machine solely via the vibration-damping material, and
   wherein the vibration damping layer in nano-dimensional cluster form has a number of sub-layers in a superlattice where the number of layers is from 10-10000.

21. A method for manufacturing an appliance for chip removal applications according to claim 1, comprising the following steps:
   a) providing an appliance for chip removal applications; and
   b) precipitating on a shaft of said appliance a ceramic material comprising carbon nitride in nano-dimensional cluster form, thereby giving a vibration damping effect in said appliance, and
   wherein the applied damping material is a composite material arranged by multilayer structure that consists of alternated layers of metal or metal compounds of one kind and metal or metal compounds of another kind.

22. A method according to claim 21 wherein said appliance is movable or immovable.

23. A method according to claim 21 wherein said ceramic material is precipitated as a thin layer on the surface of said shaft of the appliance.

24. A method according to claim 21 wherein said ceramic material is precipitated as a thin layer on the surface of said shaft wherein said layer is from 1 μm to 1000 μm.

25. A method according to claim 21 wherein said nano-dimensional cluster of said ceramic material has a size of from 0.5 to 100 nm.

26. A method according to claim 21 wherein the precipitation of step b) is performed by using magnetron sputter deposition technology, pulsed, high power pulsed, reactive coating or arc technology, or chemical vapor deposition (CVD) technology, or physical vapor deposition (PVD) technology or Plasma spray technology, or a combination of said technologies.

27. A method according to claim 21 wherein the precipitation of step b) is performed using $A_r$, N, $CH_4$ or $C_2H_2$, or CO, or $CO_2$ gas or a combination thereof.

28. A method according to claim 21 wherein the precipitation of step b) is performed at a temperature of said article or work piece from 50 to 1500° C.

29. A method according to claim 21 wherein the applied damping material is a composite material arranged by multilayer structure that consists of alternated layers of metals and metal nitride.

30. A method according to claim 21 wherein the applied damping material is a composite material arranged by multilayer structure that consists of alternated layers of metals and metal oxide.

31. A method according to claim 21 wherein the uniformity of thickness of the vibration damping layer is from 0.1 to 10%.

32. A method according to claim 21 wherein the vibration damping layer in nano-dimensional cluster form has a number of sub-layers in a superlattice which is 10-10000.

33. A method according to claim 21 wherein the precipitation of step b) is performed in a reactor;
   comprising a cathode and anode separated by a magnetic field, and by:
   (a) using the cathode to provide a magnetic field in the reactor;
   (b) placing an appliance in a chamber;
   (c) introducing one or more carbon containing process gases and reactive gas into the chamber;
   (d) energizing the process gas and reactive gas to form a plasma to decompose the process gas into radicals and further to deposit carbon material on the appliance and ionize the reactive gas to increase the rate of nitrogen chemisorption to the carbon; and
   (e) exhausting the gases after decomposition and chemisorption from the chamber.

34. A method according to claim 33 wherein the appliance is rotated at a speed of about 0.25 rpm.

35. A method according to claim 33 wherein the process gases is acetylene and/or methane and/or carbon oxide, and/or carbon dioxide and reactive gas is nitrogen.

36. A method according to claim 33 wherein the pressure in the reactor is from $10^{-4}$ torr to 1000 torr.

37. A method according to claim 33 wherein the current amplitude is about from 1 to 1000 A, the pulse length is from about 10 μs to 10 s and the frequency is from about 0.1 to 10000 Hz.

38. A method according to claim 33 wherein the pulsed power is from about 100 W to 1 MW.

39. A method according to claim 33 which combines CVD cracking process and PVD cracking hardware including a cathode having a balanced or unbalanced magnetic field.

40. A method according to claim 33 wherein the anode-cathode high current pulsed electric discharge is normal, or abnormal, or transition abnormal to arc glow discharge.

41. A method according to claim 33 wherein the strength of the magnetic field during the deposition is from 0.01 to 0.3 Tesla.

42. An appliance according to claim 21 wherein said appliance is a tool holder, cutting insert, drill, rotary file, collet or mounting device.

\* \* \* \* \*